US012772780B2

(12) United States Patent
Sueyoshi et al.

(10) Patent No.: US 12,772,780 B2
(45) Date of Patent: Oct. 20, 2026

(54) PROCESSING APPARATUS, RECORDING MEDIUM, SUBSTRATE PROCESSING METHOD, AND METHOD OF MANUFACTURING SEMICONDUCTOR DEVICE

(71) Applicant: Kokusai Electric Corporation, Tokyo (JP)

(72) Inventors: Masako Sueyoshi, Toyama (JP); Makoto Nomura, Toyama (JP); Taku Hisada, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 452 days.

(21) Appl. No.: 18/468,179

(22) Filed: Sep. 15, 2023

(65) Prior Publication Data

US 2024/0006206 A1 Jan. 4, 2024

Related U.S. Application Data

(63) Continuation of application No. PCT/JP2021/013111, filed on Mar. 26, 2021.

(51) Int. Cl.
*G05B 19/418* (2006.01)
*G05B 19/18* (2006.01)
(Continued)

(52) U.S. Cl.
CPC ........ *H10P 72/0602* (2026.01); *G05B 19/188* (2013.01); *H10P 72/0436* (2026.01); *H10P 95/90* (2026.01); *G05B 2219/45031* (2013.01)

(58) Field of Classification Search
CPC .. H10P 72/0602; H10P 72/0436; H10P 95/90; G05B 19/188; G05B 2219/45031;
(Continued)

(56) References Cited

U.S. PATENT DOCUMENTS 6,855,916 B1 * 2/2005 Matthews ......... H01L 21/67109 118/724
7,557,328 B2 * 7/2009 Ohata .................... G05D 23/22 118/725
(Continued)

FOREIGN PATENT DOCUMENTS

CN 102907181 A * 1/2013 ........ H01J 37/32522
CN 111492466 A 8/2020
(Continued)

OTHER PUBLICATIONS

International Search Report, PCT/JP2021/013111, Jun. 22, 2021.
Chinese Office Action issued on May 1, 2026 for Chinese Patent Application No. 202180094576.7.

*Primary Examiner* — Yongjia Pan
(74) *Attorney, Agent, or Firm* — Volpe Koenig

(57) ABSTRACT

There is provided a technique that includes: a storage storing at least a temperature control table where a set value of a heater heating a substrate and a set value of a lamp heating the substrate are set for a target temperature of the substrate, and a process recipe constituted by steps of processing the substrate; and a controller capable of performing a control of executing the process recipe, wherein the controller is capable of performing a control of: searching the temperature control table with target temperature corresponding to a substrate temperature set in the process recipe; and setting a set value for the target temperature corresponding to the substrate temperature to at least one selected from the group of a temperature set value of the heater, a temperature ratio of the heater, a power set value of the lamp, and a lamp rate value in the process recipe.

18 Claims, 9 Drawing Sheets

(51) Int. Cl.
*H10P 72/00* (2026.01)
*H10P 95/90* (2026.01)

(58) Field of Classification Search
CPC ............ G05B 19/418; H01L 21/67248; H01L 21/67115; H01L 21/67103; H01L 21/67276; G05D 23/1902; H01J 37/32192; H01J 37/32724
See application file for complete search history.

(56) References Cited

U.S. PATENT DOCUMENTS

| | | | | |
|---|---|---|---|---|
| 11,367,645 | B2 * | 6/2022 | Criminale | H01L 21/67288 |
| 2002/0072025 | A1 * | 6/2002 | Ookura | H01L 21/67248 118/724 |
| 2004/0010501 | A1 * | 1/2004 | Anderson | G06F 30/20 |
| 2004/0173311 | A1 * | 9/2004 | Ichimaru | H01L 21/67069 156/345.52 |
| 2005/0047767 | A1 * | 3/2005 | Nozaki | F27D 5/0037 219/390 |
| 2008/0255683 | A1 * | 10/2008 | Takahashi | G05D 23/1935 219/494 |
| 2009/0177310 | A1 * | 7/2009 | Dao | H01L 21/67098 700/121 |
| 2012/0225566 | A1 | 9/2012 | Hamano et al. | |
| 2014/0188269 | A1 * | 7/2014 | Orschel | G05B 19/0426 700/159 |
| 2015/0132863 | A1 * | 5/2015 | Oohashi | H01J 37/32935 438/5 |
| 2015/0134647 | A1 * | 5/2015 | Sayyarrodsari | G06F 16/9024 703/22 |
| 2016/0086818 | A1 | 3/2016 | Hamano et al. | |
| 2018/0284716 | A1 * | 10/2018 | Takenaga | G05B 19/188 |
| 2019/0198299 | A1 * | 6/2019 | Watanabe | H01L 21/67115 |
| 2019/0286632 | A1 * | 9/2019 | Okuyama | G06F 16/2462 |
| 2021/0351051 | A1 * | 11/2021 | Wirth | H01L 21/6831 |
| 2021/0366791 | A1 * | 11/2021 | Tanaka | H01L 21/67248 |

FOREIGN PATENT DOCUMENTS

| | | | | | |
|---|---|---|---|---|---|
| JP | 2007201295 | A | * | 8/2007 | |
| JP | 2007-311618 | A | | 11/2007 | |
| JP | 2008-288282 | A | | 11/2008 | |
| JP | 4364468 | B2 | * | 11/2009 | |
| JP | 2012-231001 | A | | 11/2012 | |
| JP | 2019165123 | A | * | 9/2019 | H01J 37/32929 |
| JP | 6771418 | B2 | * | 10/2020 | G05B 19/41875 |

* cited by examiner

FIG. 3

| Temperature control item | Setting item |
|---|---|
| Heater | Temperature set value |
| | Temperature ramping set value |
| | Power set value |
| | Power ramping set value |
| | Input side/output side ratio set value |
| Lamp unit | Power set value |
| | Power ramping set value |
| High-frequency power supply | Power set value |
| | Power ramping set value |
| | Power initial set value |
| Microwave generator | Power set value |
| | Standby power set value |
| Chiller | Temperature set value |

FIG. 4

Temperature control table

| No | Wafer temperature (℃) | Heater control | | Lamp control (raising temperature) | | | Lamp control (process) | |
|---|---|---|---|---|---|---|---|---|
| | | Temperature set value (℃) | Temperature ratio | Time (sec) | Power set value (%) | Lamp rate (%/sec) | Power set value (%) | Lamp rate (%/sec) |
| 1 | 300 | 346 | 0.67 | 0 | 0 | 0 | 0 | 0 |
| 2 | 500 | 675 | 0.67 | 0 | 0 | 0 | 0 | 0 |
| 3 | 700 | 927 | 0.57 | 0 | 0 | 0 | 0 | 0 |
| 4 | 725 | 927 | 0.57 | 40 | 33 | 10 | 30 | 0.2 |
| 5 | 750 | 927 | 0.57 | 40 | 45 | 10 | 41 | 0.2 |
| 6 | 775 | 927 | 0.57 | 40 | 59 | 10 | 51 | 0.2 |
| 7 | 800 | 927 | 0.57 | 40 | 74 | 10 | 64 | 0.2 |
| 8 | 0 | 0 | 0 | 0 | 0 | 0 | 0 | 0 |
| ⋮ | 0 | 0 | 0 | 0 | 0 | 0 | 0 | 0 |
| 20 | 0 | 0 | 0 | 0 | 0 | 0 | 0 | 0 |

FIG. 5

Process recipe

| No | Event | Time | Heater | High-frequency power supply | | Lamp unit |
|---|---|---|---|---|---|---|
| | | | Wafer temperature (℃) | RF | Power (w) | Control mode |
| 1 | Event A | T1 | 700 | Off | 0 | Off |
| 2 | Event B | T2 | 700 | Off | 0 | Off |
| 3 | Event C | T3 | 700 | Off | 0 | Off |
| 4 | Event D | T4 | 700 | Off | 0 | Off |
| 5 | Event E | T5 | 700 | Off | 0 | Off |
| 6 | Event F | T6 | 800 | Off | 0 | On |
| 7 | Event G | T7 | 800 | On | 3500 | On |
| 8 | Event H | T8 | 800 | On | 3500 | On |
| 9 | Event I | T9 | 700 | Off | 0 | Off |
| 10 | Event J | T10 | 700 | Off | 0 | Off |
| Total time | | T_Total | | | | |

PROCESSING APPARATUS, RECORDING MEDIUM, SUBSTRATE PROCESSING METHOD, AND METHOD OF MANUFACTURING SEMICONDUCTOR DEVICE

CROSS-REFERENCE TO RELATED APPLICATION

This application is a Bypass Continuation Application of PCT International Application No. PCT/JP2021/013111, filed Mar. 26, 2021, the disclosure of which is incorporated herein in its entirety by reference.

TECHNICAL FIELD

The present disclosure relates to a processing apparatus, a recording medium, a substrate processing method, and a method of manufacturing a semiconductor device.

BACKGROUND

As a process of manufacturing a semiconductor device, there is a substrate processing apparatus configured to heat a substrate and performs processes such as nitridation, oxidation, annealing, and the like.

In the related art, a substrate processing apparatus configured to raise a temperature of a process chamber by using both a susceptor heater and a lamp heater is disclosed.

In the related art, a substrate processing apparatus configured to heat a substrate with a resistance heater and use a lamp heater as an auxiliary heater is disclosed.

In the related art, a substrate processing apparatus configured such that a temperature of a lamp and a temperature of a heater are capable of being set on a setting screen is disclosed.

In the substrate processing apparatuses as described above, when heating the substrate, a combination of set values for a plurality of temperature control items such as a heater, a lamp unit, and a high-frequency power supply may be set.

SUMMARY

Some embodiments of the present disclosure provide a technique capable of creating a process recipe and controlling a temperature of a wafer by designating a wafer temperature as a target temperature, thereby reducing setting errors.

According to some embodiments of the present disclosure, there is provided a technique that includes: a storage configured to store at least a temperature control table in which a set value of a heater configured to heat a substrate and a set value of a lamp configured to heat the substrate are set for a target temperature of the substrate, and a process recipe constituted by a plurality of steps of processing the substrate; and a controller configured to be capable of performing a control of executing the process recipe, wherein the controller is further configured to be capable of performing a control of: searching the temperature control table with a target temperature corresponding to a substrate temperature set in the process recipe; and setting a set value for the target temperature corresponding to the substrate temperature to at least one selected from the group of a temperature set value of the heater, a temperature ratio of the heater, a power set value of the lamp, and a lamp rate value in the process recipe.

BRIEF DESCRIPTION OF DRAWINGS

The accompanying drawings, which are incorporated in and constitute a part of the specification, illustrate embodiments of the present disclosure.

FIG. 3 is a diagram showing an example of temperature control items when heating a substrate, and set values of setting items in each temperature control item.

FIG. 4 is a diagram showing an example of a temperature control table stored in a memory or an external memory.

FIG. 5 is a diagram showing an example of a process recipe stored in a memory or an external memory.

DETAILED DESCRIPTION

Figure 1:
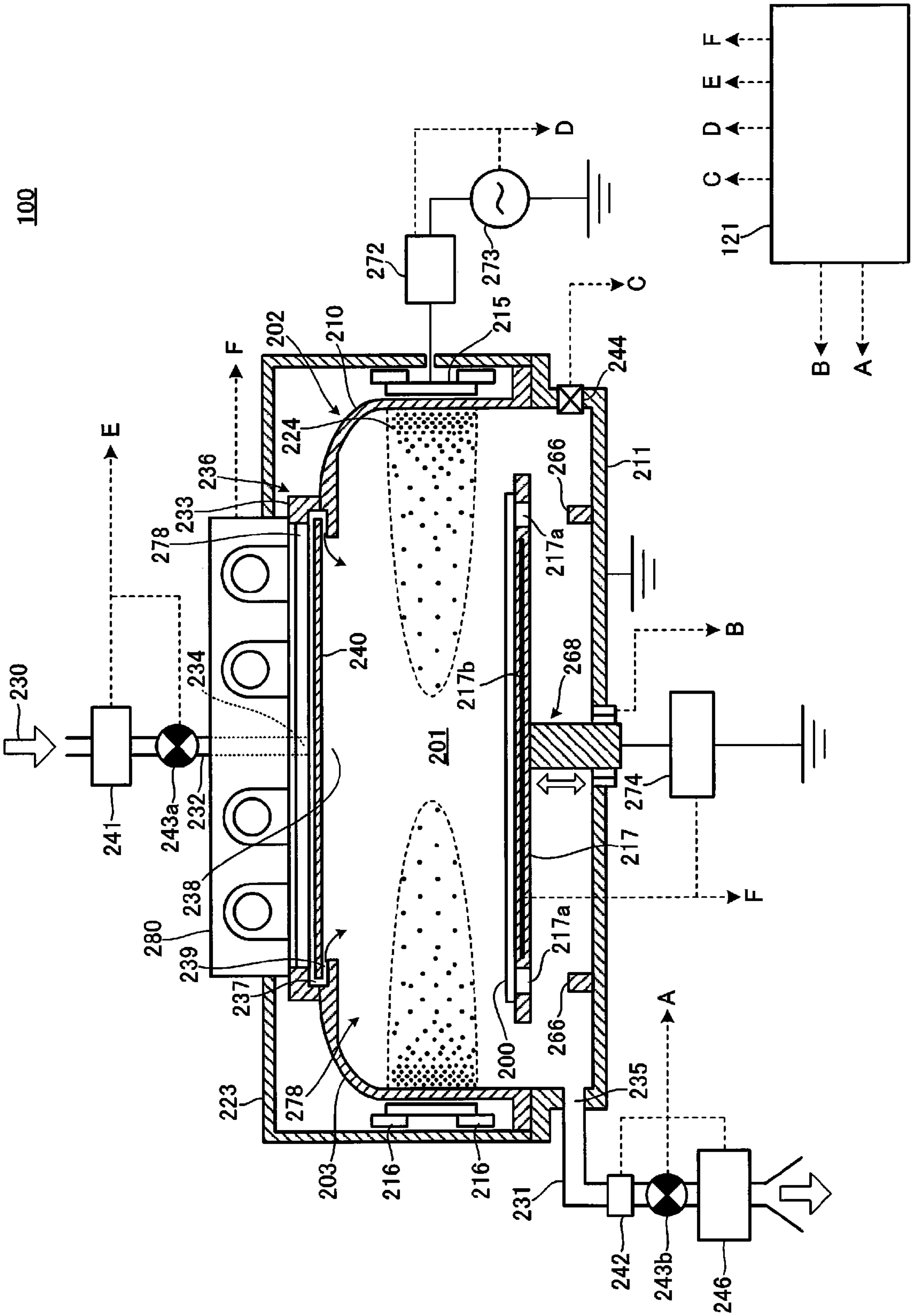
FIG. 1 is a longitudinal and cross-sectional view showing a substrate processing apparatus suitably used in embodiments of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components are not described in detail so as not to unnecessarily obscure aspects of the various embodiments.

Embodiments of the present disclosure will now be described with reference to the drawings. The drawings used in the following description are schematic, and dimensional relationships, ratios, and the like of various components shown in figures may not match actual ones. Further, dimensional relationship, ratios, and the like of various components among plural figures may not match one another.

(1) Configuration of Substrate Processing Apparatus

A substrate processing apparatus 100 includes a process container 203. The process container 203 is formed by a dome-shaped upper container 210 as a first container and a bowl-shaped lower container 211 as a second container. The upper container 210 covers the lower container 211 from above. The upper container 210 is made of a non-metallic material such as aluminum oxide or quartz, and the lower container 211 is made of, for example, aluminum. A light-transmitting window 278 is arranged on an upper surface of the process container 203, and a lamp unit (light source) 280 is installed at an outside of the process container 203 corresponding to the light-transmitting window 278. Further, by forming a susceptor 217, which is a heater-integrated substrate holder (substrate holding means or unit) to be described later, made of a non-metallic material such as aluminum nitride, ceramics, or quartz, metal contamination introduced into a film during processing is reduced.

A shower head 236 is installed at an upper side of a process chamber (reaction chamber) 201 and includes a ring-shaped frame 233, the light-transmitting window 278, a gas introduction port 234, a buffer chamber 237, an opening 238, a shielding plate 240, and a gas ejection port 239. The buffer chamber 237 is provided as a distribution space configured to distribute a gas introduced from the gas introduction port 234.

A gas supply pipe 232 configured to supply a gas is connected to the gas introduction port 234. The gas supply pipe 232 is connected to a gas cylinder (not shown) of a reaction gas 230 via a valve 243*a*, which is an opening/closing valve, and a mass flow controller 241 which is a flow rate controller (flow rate control means or unit). A gas exhaust port 235 configured to exhaust a gas is provided at a side wall of the lower container 211 such that the reaction gas 230 is supplied from the shower head 236 to the process chamber 201 and a gas after substrate processing flows from surroundings of the susceptor 217 toward the bottom of the process chamber 201. A gas exhaust pipe 231 configured to exhaust a gas is connected to the gas exhaust port 235. The gas exhaust pipe 231 is connected to a vacuum pump 246 as an exhauster, via an APC 242 as a pressure regulator, and a valve 243*b* as an opening/closing valve.

A tubular electrode 215, which is a first electrode formed in a tubular shape, for example, a cylindrical shape, is installed as a discharger (discharge electrode) configured to excite the supplied reaction gas 230. The tubular electrode 215 is installed on the outer periphery of the process container 203 (the upper container 210) to surround a plasma generation region 224 inside the process chamber 201. A high-frequency power supply 273 configured to apply a high-frequency electric power is connected to the tubular electrode 215 via a matcher 272 configured to perform an impedance matching.

Tubular magnets 216, which are magnetic field formation equipment (magnetic field formation means or units) formed in a tubular shape, for example, a cylindrical shape, are tubular permanent magnets. The tubular magnets 216 are arranged near upper and lower ends of an outer surface of the tubular electrode 215. Upper and lower tubular magnets 216 and 216 include magnetic poles at both ends (inner peripheral end and outer peripheral end) of the process chamber 201 along a radial direction thereof, and magnetic pole directions of the upper and lower tubular magnets 216 and 216 are set in opposite directions. Therefore, the magnetic poles on the inner peripheral side are of different polarities, whereby magnetic lines of force are formed along the inner peripheral surface of the tubular electrode 215 in a cylindrical axial direction.

The susceptor 217 as a substrate holder (substrate holding means or unit) configured to hold a wafer 200, which is a substrate, is arranged at the center of the bottom side of the process chamber 201. The susceptor 217 is made of a non-metallic material such as aluminum nitride, ceramics, or quartz and includes a heater 217*b* integrally embedded therein, as a heating equipment (heating means or unit), such that the wafer 200 may be heated. The heater 217*b* is configured to be capable of heating the wafer 200 when electrical power is applied to the heater 217*b*. The heater 217*b* is configured as a first heater configured to place and heat the wafer 200 on the susceptor 217.

The susceptor 217 is also equipped therein with a second electrode configured to change an impedance, and the second electrode is grounded via an impedance changer 274. The impedance changer 274 includes a coil and a variable capacitor and is configured to be capable of controlling a potential of the wafer 200 through the electrode and the susceptor 217 by controlling the number of patterns of the coil and a capacitance value of the variable capacitor.

A process furnace 202 configured to process the wafer 200 by magnetron discharge in a magnetron-type plasma source includes at least the process chamber 201, the process container 203, the susceptor 217, the tubular electrode 215, the tubular magnet 216, the shower head 236, and the exhaust port 235, such that the wafer 200 may be plasma-processed in the process chamber 201.

A shielding board 223 configured to effectively shield an electric filed and a magnetic field formed by the tubular electrode 215 and the tubular magnet 216 is provided around the tubular electrode 215 and the tubular magnet such that the electric field and the magnetic field do not adversely affect an external environment and equipment such as other process furnaces.

The susceptor 217 is insulated from the lower container 211 and is provided with a susceptor elevator (elevator) 268 configured to elevate the susceptor 217. Through-holes 217*a* are formed in the susceptor 217, and at least three wafer push-up pins 266 configured to push up the wafer 200 are formed on the bottom surface of the lower container 211. When the susceptor 217 is lowered by the susceptor elevator 268, the through-holes 217*a* and the wafer push-up pins 266 are arranged to be in such a positional relationship that the wafer push-up pins 266 pass through the through-holes 217*a* in a non-contact state with the susceptor 217.

Further, a gate valve 244 serving as a partition valve is installed at the side wall of the lower container 211. When the gate valve 244 is opened, the wafer 200 may be loaded into or unloaded out of the process chamber 201 by a transfer equipment (transporter) not shown in the figure. When the gate valve 244 is closed, the process chamber 201 may be hermetically closed.

Next, a peripheral structure of the lamp unit 280 will be described.

The lamp unit 280 is arranged on the frame 233 and includes at least one (four in the embodiments of the present disclosure) heating lamps. The light-transmitting window 278 is formed in a columnar shape and is supported by the frame 233 via a seal (not shown). The light-transmitting window 278 is formed of a transmitting member that allows light and heat emitted from the lamp unit 280 to pass therethrough. The lamp unit 280 is configured as a second heater configured to heat the wafer 200 from the outside of the process container 203.

A cooling path (not shown) as a coolant is installed in the frame 233. By circulating a cooling medium (for example, cooling water) through the cooling path, an environmental temperature around the seal is lowered.

(2) Configuration of Controller

Figure 2:
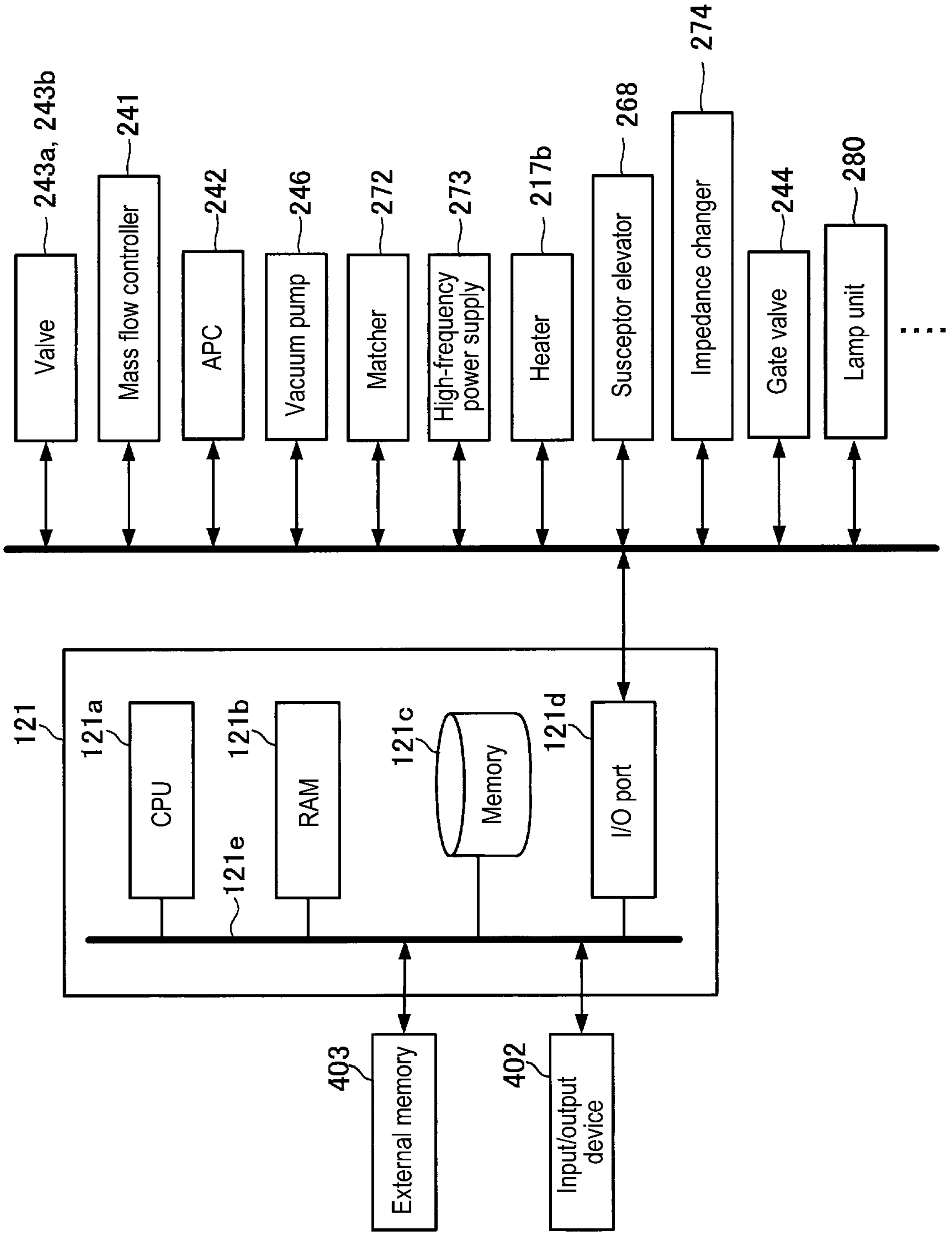
FIG. 2 is a schematic configuration diagram of a controller of a substrate processing apparatus suitably used in embodiments of the present disclosure, in which a control system of the controller is shown in a block diagram.

As shown in FIG. 2, a controller 121, which is a control part (control means or unit), is configured as a computer including a CPU (Central Processing Unit) 121*a*, a RAM (Random Access Memory) 121*b*, a memory 121*c*, and an I/O port 121*d*. The RAM 121*b*, the memory 121*c* as a storage, and the I/O port 121*d* are configured to be capable of exchanging data with the CPU 121*a* via an internal bus 121*e*. An input/output device 402 configured as, for example, a touch panel or the like, is connected to the controller 121.

The memory 121*c* is configured by, for example, a flash memory, a HDD (Hard Disk Drive), or the like. A control program that controls operations of a substrate processing apparatus, a recipe in which predetermined processing procedures (hereinafter also referred to as steps), process conditions, and the like are written, etc. are readably stored in the memory 121*c*. A process recipe constituted mainly by a plurality of steps functions as a program that causes the controller 121 to execute each step in a predetermined process to obtain an expected result. Hereinafter, the recipe including the process recipe and the control program may be generally and simply referred to as a "program." Furthermore, the process recipe may be simply referred to as a "recipe." When the term "program" is used herein, it may indicate a case of including the recipe, a case of including the control program, or a case of including both the recipe and the control program. The RAM 121*b* is configured as a memory area (work area) in which programs or data read by the CPU 121*a* are temporarily stored.

The I/O port 121*d* is connected to the valves 243*a* and 243*b*, the mass flow controller 241, the APC 242, the vacuum pump 246, the matcher 272, the high-frequency power supply 273, the heater 217*b*, the susceptor elevator 268, the impedance changer 274, the gate valve 244, the lamp unit 280, and so on.

The CPU 121*a* is configured to read and execute the control program from the memory 121*c*. The CPU 121*a* is also configured to read the process recipe from the memory 121*c* according to an input of an operation command from the input/output device 402. As shown in FIG. 1, the CPU 121*a* is configured to control the APC 242, the valve 243*b*, and the vacuum pump 246 through the I/O port 121*d* and a signal line A, the susceptor elevator 268 through a signal line B, the gate valve 244 through a signal line C, the matcher 272 and the high-frequency power supply 273 through a signal line D, the mass flow controller 241 and the valve 243*a* through a signal line E, and the heater 217*b*, the impedance changer 274, and the lamp unit 280 through a signal line F, respectively, according to contents of the read recipe.

The controller 121 may be configured by installing, on the computer, the aforementioned program stored in an external memory 403 which is a storage. Examples of the external memory 403 may include, for example, a semiconductor memory such as a USB memory, and the like. The memory 121*c* or the external memory 403 is configured as a computer-readable recording medium. Hereinafter, the memory 121*c* and the external memory 403 may be generally and simply referred to as a "recording medium." When the term "recording medium" is used herein, it may indicate a case of including the memory 121*c*, a case of including the external memory 403, or a case of including both the memory 121*c* and the external memory 403. Furthermore, the program may be provided to the computer by using communication means or unit such as the Internet or a dedicated line, instead of using the external memory 403.

(3) Substrate-Processing Process

Next, as a process of manufacturing a semiconductor device by using the substrate processing apparatus configured as described above, a method of performing a predetermined process on a surface of the wafer 200 or a surface of a base film formed on the wafer 200 will be described. In the following description, operations of the respective components constituting the substrate processing apparatus 100 are controlled by the controller 121.

The wafer 200 is loaded into the process chamber 201 from the outside of the process chamber 201 constituting the process furnace 202 by a transfer equipment (not shown) configured to transfer the wafer, and is transferred onto the susceptor 217. The details of such a transfer operation are as follows. The susceptor 217 is lowered to a substrate transfer position, and tips of the wafer push-up pins 266 pass through the through-holes 217*a* of the susceptor 217. At this time, the wafer push-up pins 266 protrudes from the surface of the susceptor 217 by a predetermined height. Next, the gate valve 244 installed at the lower container 211 is opened, and the wafer 200 is placed on the tips of the wafer push-up pins 266 by a transfer equipment (not shown). When the transfer equipment retreats outside the process chamber 201, the gate valve 244 is closed. When the susceptor 217 is lifted by the susceptor elevator 268, the wafer 200 may be placed on the upper surface of the susceptor 217 and is further raised to a position for processing the wafer 200.

The heater 217*b* embedded in the susceptor 217 is heated in advance, and the lamp unit 280 may also be heated to heat the loaded wafer 200 to a wafer temperature (substrate temperature) which is a predetermined processing temperature. The vacuum pump 246 and the APC 242 are used to maintain a pressure of the process chamber 201 at a predetermined pressure.

When the temperature of the wafer 200 reaches and stabilizes at the wafer temperature, a reaction gas is introduced from the gas introduction port 234 via the gas ejection port 239 of the shielding plate 240 toward the upper surface (processing surface) of the wafer 200 placed in the process chamber 201. A gas flow rate at this time is set to a predetermined flow rate. At the same time, high-frequency electric power is applied from the high-frequency power supply 273 to the tubular electrode 215 via the matcher 272. As for the electric power to be applied, a predetermined output value is applied. At this time, the impedance changer 274 is controlled in advance such that a desired impedance value is set.

A magnetron discharge is generated under influence of the magnetic fields of the tubular magnets 216 and 216, and charges are trapped in a space above the wafer 200 to generate high-density plasma in the plasma generation region 224. Then, plasma processing is performed on the surface of the wafer 200 on the susceptor 217 by the generated high-density plasma. The plasma-processed wafer 200 is transferred out of the process chamber 201 by using the transfer equipment (not shown) in the reverse order of substrate loading.

(4) Temperature Control by Controller

Next, temperature control by the controller 121 in embodiments of the present disclosure will be described. In the present disclosure, when the controller 121 executes the process recipe in the above-described substrate-processing process, the controller 121 is configured to control the wafer temperature by using set values of the heater 217*b* and set values of the lamp unit 280 in a temperature control table stored in the memory 121*c* or the external memory 403.

The wafer temperature when processing the wafer 200 is affected by set values of a plurality of setting items of a plurality of temperature control items such as a heater, a lamp unit, a high-frequency power supply, a microwave generator (microwave unit), and a chiller (cooler), for example, as shown in FIG. 3.

In the present disclosure, the memory 121*c* or the external memory 403 is configured to store the temperature control table that associates set values for a plurality of setting items of the heater 217*b* configured to heat the wafer 200 and set values for a plurality of setting items of the lamp unit 280 configured to heat the wafer 200 with the wafer temperature which is the target temperature of the wafer 200, and the process recipe constituted by a plurality of steps of processing the wafer 200 in the above-described substrate-processing process. FIG. 4 shows an example of the temperature control table, and FIG. 5 shows an example of the process recipe.

As shown in FIG. 4, in the temperature control table, a heater control value to control the heater 217*b* that includes: a temperature set value (degrees C.) of the heater 217*b*; and a temperature ratio as a power ratio between an input side and an output side of the heater 217*b*, and a lamp control value to control the lamp unit 280 that includes: a temperature-raising time (seconds) in a temperature-raising step when raising the temperature of the lamp unit 280; a power set value (%) in the temperature-raising step of the lamp unit 280; a lamp rate (%/sec) in the temperature-raising step of the lamp unit 280; a power set value (%) in a process step when the lamp unit 280 is stabilized at the set wafer temperature after the temperature of the lamp unit 280 is raised; and a lamp rate (%/sec) in the process step of the lamp unit 280 are set in a corresponding relationship (in association) with the wafer temperature (degrees C.) which is the target temperature when each step of the process recipe is set. That is, the lamp control value includes a first control value, which is a control value to raise the temperature of the lamp unit 280 to the wafer temperature set in the process recipe, and a second control value which is a control value to stabilize the temperature of the lamp unit 280 at the wafer temperature set in the process recipe. Further, the first control value and the second control value may be set with respect to the wafer temperature, which is one target temperature, and the first control value and the second control value may be set in one of the plurality of steps of the process recipe. Thus, the temperature of the wafer 200 may be controlled by the heater 217*b* and the lamp unit 280, and the wafer 200 may be stabilized and processed at a desired temperature.

As shown in FIG. 5, the process recipe stores an event name, an event time, a wafer temperature, an on/off of and power set value (W) of the high-frequency power supply, a control mode of the lamp unit 280, a position of the susceptor 217, a gas flow rate, a processing pressure, and so on in each step, in a corresponding manner.

Figure 6:
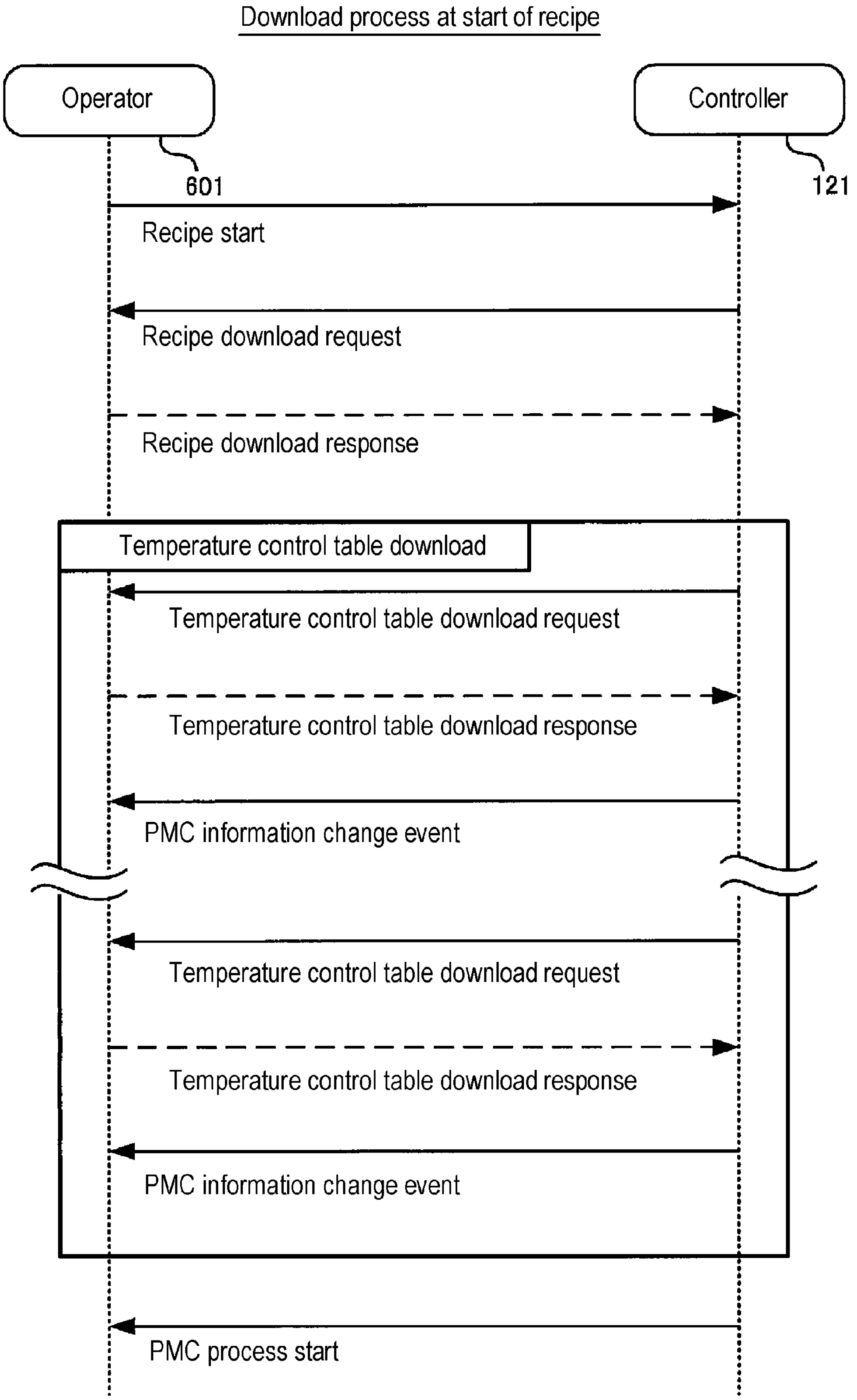
FIG. 6 is a diagram for explaining download process of a process recipe and a temperature control table at the start of the process recipe.

FIG. 6 is a diagram showing a download process of the process recipe and the temperature control table at the start of the process recipe.

An operator 601 includes an editing screen and is configured to be capable of editing the process recipe and the temperature control table. The operator 601 is further configured to perform transmission to the controller 121. The operator 601 is further configured to display an execution state of the process recipe and the like on an operation screen.

The controller 121 is further configured to request download of the process recipe and the temperature control table or to communicate with the plurality of temperature control items such as the heater 217*b*, the lamp unit 280, and the high-frequency power supply 273.

First, when the operator 601 inputs a recipe start operation, the controller 121 is notified of the input. Then, the controller 121 transmits a download request for the process recipe and the temperature control table to the operator 601. As a result, the process recipe and the temperature control table are downloaded from the operator 601 to the controller 121, and the controller 121 may use the temperature control table to control the process recipe.

Figure 7:
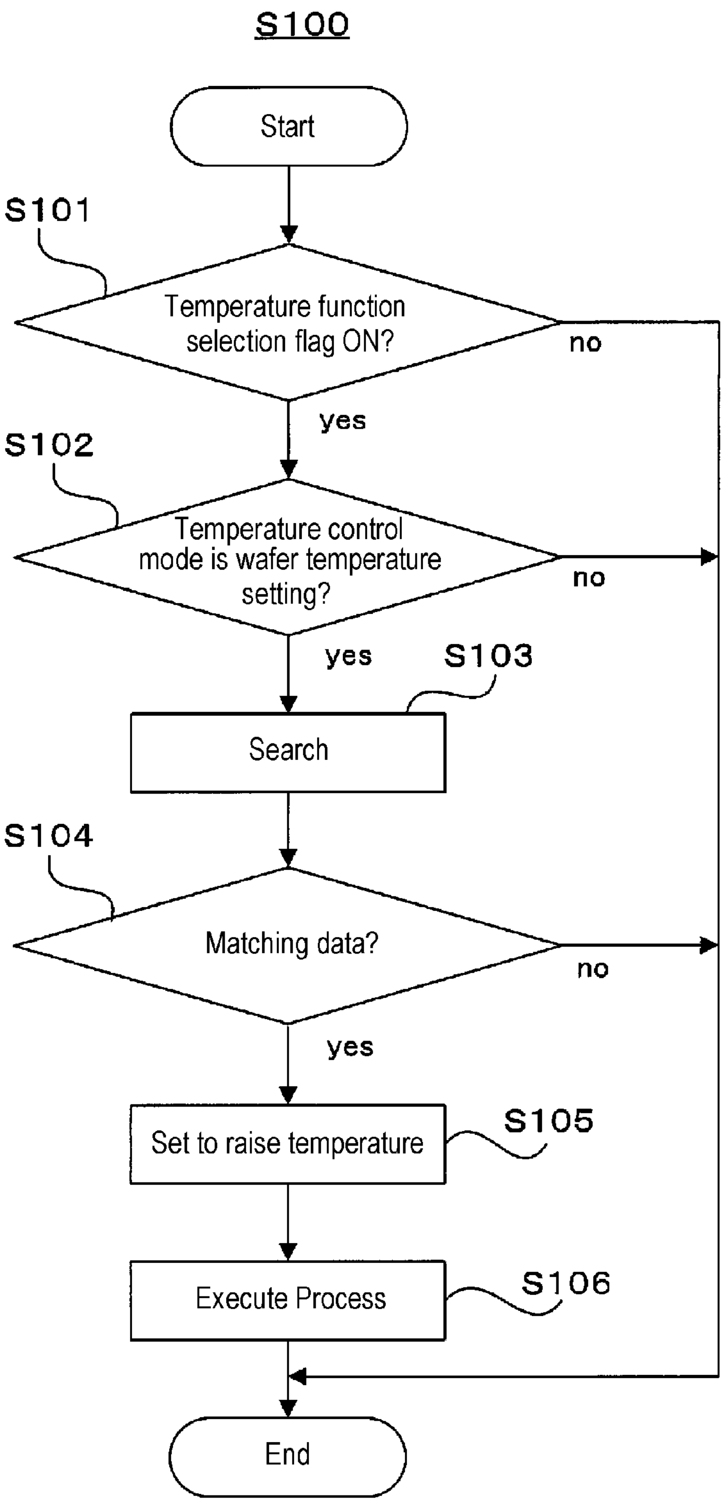
FIG. 7 is a flowchart for explaining a temperature control operation in each step.

Next, a temperature control operation S100 in which lamp heating of the controller 121 in each step of the process recipe is used will be described with reference to FIG. 7.

When starting each step (event) of the process recipe, the controller 121 determines whether or not a temperature function selection flag in the process recipe is turned on (S101).

Then, when the temperature function selection flag is turned on, the controller 121 determines whether or not a temperature control mode is wafer temperature setting (S102).

Then, when the temperature control mode is the wafer temperature setting, the controller 121 searches the temperature control table with the target temperature corresponding to the wafer temperature set in the process recipe (S103), and determines whether or not the target temperature, which is data matching the wafer temperature of the process recipe, is in the temperature control table (S104).

When there is no matching data in the temperature control table, the process is ended. When there is matching data, the controller 121 sets a set value for the target temperature corresponding to the matching wafer temperature to at least one selected from the group of the temperature set value of the heater 217*b*, the temperature ratio of the heater 217*b*, and the power set value of the lamp unit 280 and the lamp rate value in the temperature-raising step of the lamp unit 280 when the lamp unit 280 is set to raise the temperature, in the process recipe (S105), and executes a predetermined step of the process recipe (S106).

Specifically, in steps No. 1 to No. 5 and No. 9 of the process recipe in FIG. 5, the power set value of the lamp unit 280 is 0 and the lamp rate is 0, whereby no lamp control is set, such that the controller 121 controls the heater 217*b* to execute the temperature control of these steps No. 1 to No. 5 and No. 9.

Further, the controller 121 searches the temperature control table of FIG. 4 with the target temperature corresponding to the wafer temperature of 800 degrees C. set in step No. 6 in the process recipe of FIG. 5, and acquires the temperature set value of 927 degrees C. of the heater 217*b*, the temperature ratio of 0.57 of the heater 217*b*, the temperature-raising time of 40 seconds of the lamp unit 280, the power set value of 74% in the temperature-raising step of the lamp unit 280, the lamp rate of 10%/sec in the temperature-raising step of the lamp unit 280, the power set value of 64% in the process step of the lamp unit 280, and the lamp rate of 0.2%/sec in the process step of the lamp unit 280, which are set for the wafer temperature of 800 degrees C. in step No. 7 of the temperature control table of FIG. 4.

Then, the controller 121 sets the temperature set value of 927 degrees C. of the heater 217*b*, the temperature ratio of 0.57 of the heater 217*b*, the temperature-raising time of 40 seconds of the lamp unit 280, the power set value of 74% in the temperature-raising step of the lamp unit 280, and the lamp rate of 10%/sec in the temperature-raising step of the lamp unit 280, which are set for the wafer temperature of 800 degrees C. acquired from the temperature control table of FIG. 4, controls the heater 217*b* and the lamp unit 280 with such setting, and executes an event of step No. 6. When 40 seconds elapses after the temperature rise of the lamp unit 280 is started, the controller 121 controls the heater 217*b* and the lamp unit 280 with the power set value of 64% in the process step of the lamp unit 280 and the lamp rate of 0.2%/sec in the process step of the lamp unit 280 and executes an event of step No. 7. The event of step No. 7 is a step of turning on the high-frequency power supply to generate plasma and a step of stabilizing this plasma before processing the wafer 200 in the next step No. 8.

Then, when the temperature is stabilized at 800 degrees C., the controller 121 controls the heater 217*b* and the lamp unit 280 with the power set value of the lamp unit 280 and the lamp rate value in the process step in the lamp unit 280 set in step No. 7 and executes an event of step No. 8. The event of No. 8 is a step of processing the wafer 200.

That is, the controller 121 is configured to set the set values set for the target temperature corresponding to the wafer temperature in the temperature control table to the temperature set value of the heater 217*b*, the temperature ratio of the heater 217*b*, the power set value of the lamp unit 280, and the lamp rate value, respectively, in the process recipe. As a result, it is possible to create the process recipe to control the temperature of the wafer with designation of the wafer temperature as the target temperature, thereby reducing setting errors.

Further, in a case where the temperature control table shown in FIG. 4 is used, when the wafer temperature set for each step of the process recipe is 700 degrees C. or lower, the controller 121 sets a heater control value to control the heater 217*b*. When the wafer temperature is higher than 700 degrees C., the controller 121 sets a lamp control value as well as the heater control value to control the heater 217*b* and the lamp unit 280. In a case where the wafer temperature set in each step is 700 degrees C. or lower, when the lamp unit 280 as well as the heater 217*b* is used to heat the wafer 200, the temperature rises rapidly, which may cause warping of the wafer 200 and breakage of the wafer 200. Therefore, in a case where the wafer temperature set in each step in the temperature control table is higher than 700 degrees C., the controller 121 may perform a control such that the set value of the lamp unit 280 as well as the set value of the heater 217*b* is used, which may prevent the warping and breakage of the wafer 200 due to setting errors.

Further, a certain temperature-raising time is set for the lamp unit 280 after the heating is started until the target temperature is reached. Therefore, in a case where the wafer temperature set in each step is higher than 700 degrees C., the controller 121 sets the set value for each setting item in the temperature-raising step of the lamp unit 280 when the temperature of the lamp unit 280 is raised to the wafer temperature set in the process recipe, and sets the set value for each setting item in the process step of the lamp unit 280 when the temperature of the lamp unit 280 is stabilized at the wafer temperature set in the process recipe, and executes each step with such setting.

Figure 8:
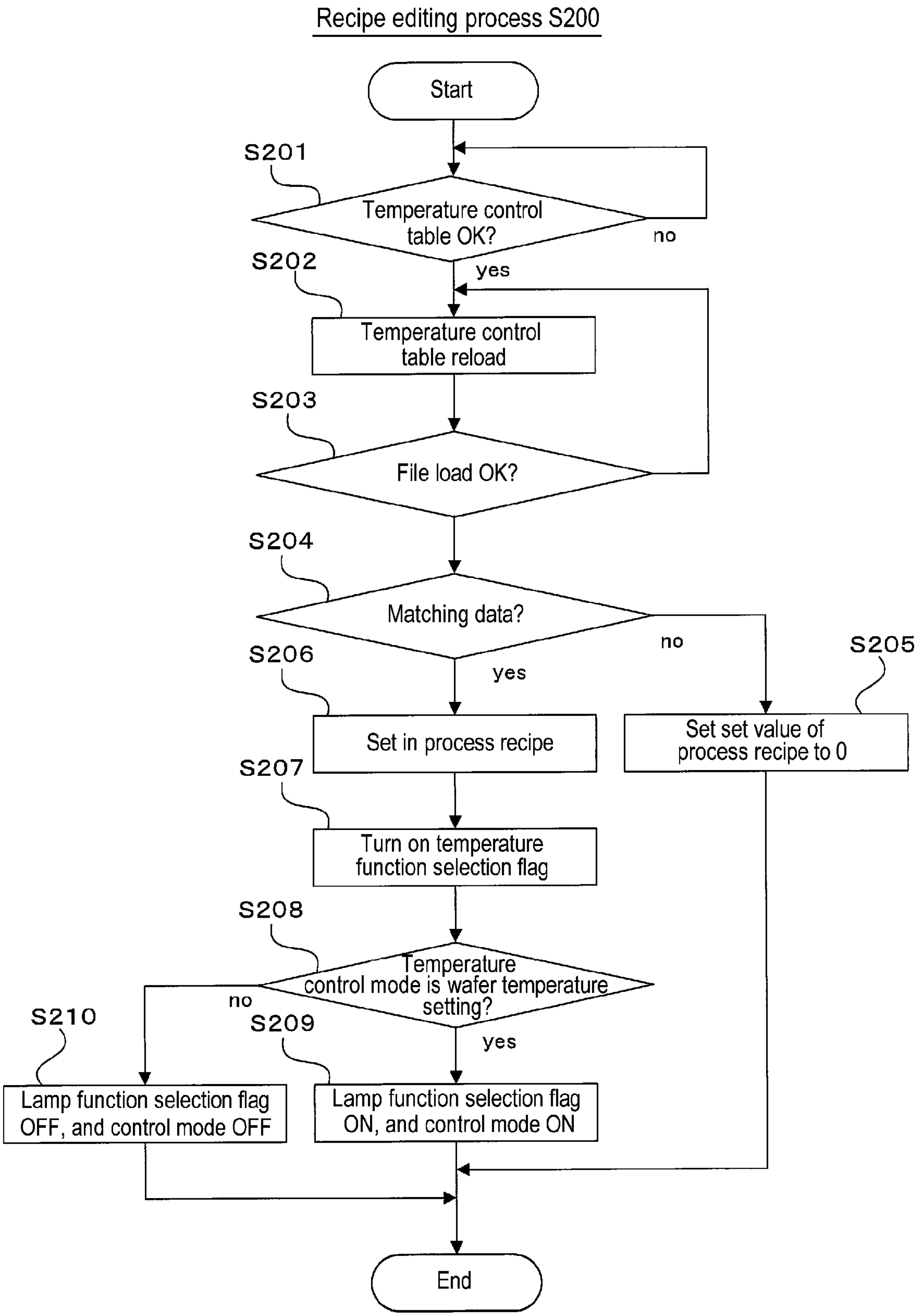
FIG. 8 is a flowchart for explaining a procedure when a recipe editing process is performed on an operation screen.

Next, a procedure when the operator 601 performs a recipe editing process S200 on the operation screen (also referred to as an editing screen) will be described with reference to FIG. 8.

The operator 601 is configured to execute any one event of download of the temperature control table, change of the temperature control table, change of a set value in the temperature control table, change of a temperature control mode set in the temperature control table, and change of a function selection button set in the temperature control table, according to a predetermined screen event. This allows a user to perform operations while checking the current set values on the operation screen.

For example, when the temperature control table is OK (S201), the operator 601 receives an event (step) finished with OK and reloads the temperature control table (S202).

Then, the operator 601 determines whether or not the reloaded temperature control table is OK (S203).

Then, the operator 601 searches the temperature control table with the target temperature corresponding to the wafer temperature set in the process recipe and determines whether or not there is data in the temperature control table that matches the target temperature corresponding to the wafer temperature set in the process recipe (S204).

When there is no matching data in the temperature control table, the controller 121 sets at least one selected from the group of the temperature set value of the heater 217*b*, the temperature ratio, the power set value of the lamp unit 280, and the lamp rate value in the process recipe to 0 (zero) (not set) (S205). That is, in a case where the controller 121 cannot extract the target temperature corresponding to the wafer temperature set in the process recipe from the temperature control table, the controller 121 performs a control such that at least one selected from the group of the temperature set value of the heater 217*b*, the temperature ratio of the heater 217*b*, the power set value of the lamp unit 280, and the lamp rate value in the process recipe is set as zero or not set. Then, the controller 121 ends the recipe editing process (S200). As a result, when creating the process recipe with designation of the wafer temperature as the target temperature, by setting zero or unsetting first, a setting standby state is entered, and setting errors are reduced.

Further, when there is no matching data in the temperature control table, the controller 121 may search the temperature control table with the target temperature corresponding to a wafer temperature closest to the wafer temperature set in the process recipe and may set the set value for the target temperature corresponding to the closest wafer temperature to at least one selected from the group of the temperature set value of the heater 217*b*, the temperature ratio of the heater 217*b*, the power set value of the lamp unit 280, and the lamp rate value in the process recipe. As a result, even in a case where the wafer temperature as the target temperature does not exist in the temperature control table, it is possible to create the process recipe to control the temperature, thereby reducing setting errors.

On the other hand, when there is matching data in the temperature control table, the controller 121 sets the set value for the target temperature corresponding to the wafer temperature in the process recipe to at least one selected from the group of the temperature set value of the heater 217*b*, the temperature ratio of the heater 217*b*, the power set value of the lamp unit 280, and the lamp rate value in the process recipe (S206). As a result, it is possible to create the process recipe to control the temperature with designation of the wafer temperature as the target temperature, thereby reducing setting errors.

Then, when the wafer temperature set in the process recipe is equal to or higher than a predetermined temperature, the controller 121 turns on the temperature function selection flag (S207). By turning on the temperature function selection flag, the operator 601 may turn on a lamp function selection flag. As a result, when the temperature function selection flag is turned on, it is possible to set the lamp control value, thereby controlling an irradiation timing of the lamp unit 280. Then, by turning on the lamp function selection flag, the lamp control value including the power set value of the lamp unit 280 and lamp rate value are set. As a result, when the wafer temperature is equal to or higher than the predetermined temperature, it is possible to set the lamp control value, thereby controlling the lamp unit 280 with accurate timing.

Then, it is determined whether or not the temperature control mode is wafer temperature setting (S208).

When the temperature control mode is the wafer temperature setting, the lamp function selection flag is turned on and the control mode is turned on, thereby enabling control by the control mode of the wafer temperature setting (S209).

On the other hand, when the temperature control mode is not the wafer temperature setting, the lamp function selection flag is turned off and the control mode is turned off (S210).

Next, a data calculation method for the temperature control table will be described with reference to FIG. 9. The data calculation method for the temperature control table includes one-point detection and two-point detection.

Figure 9:
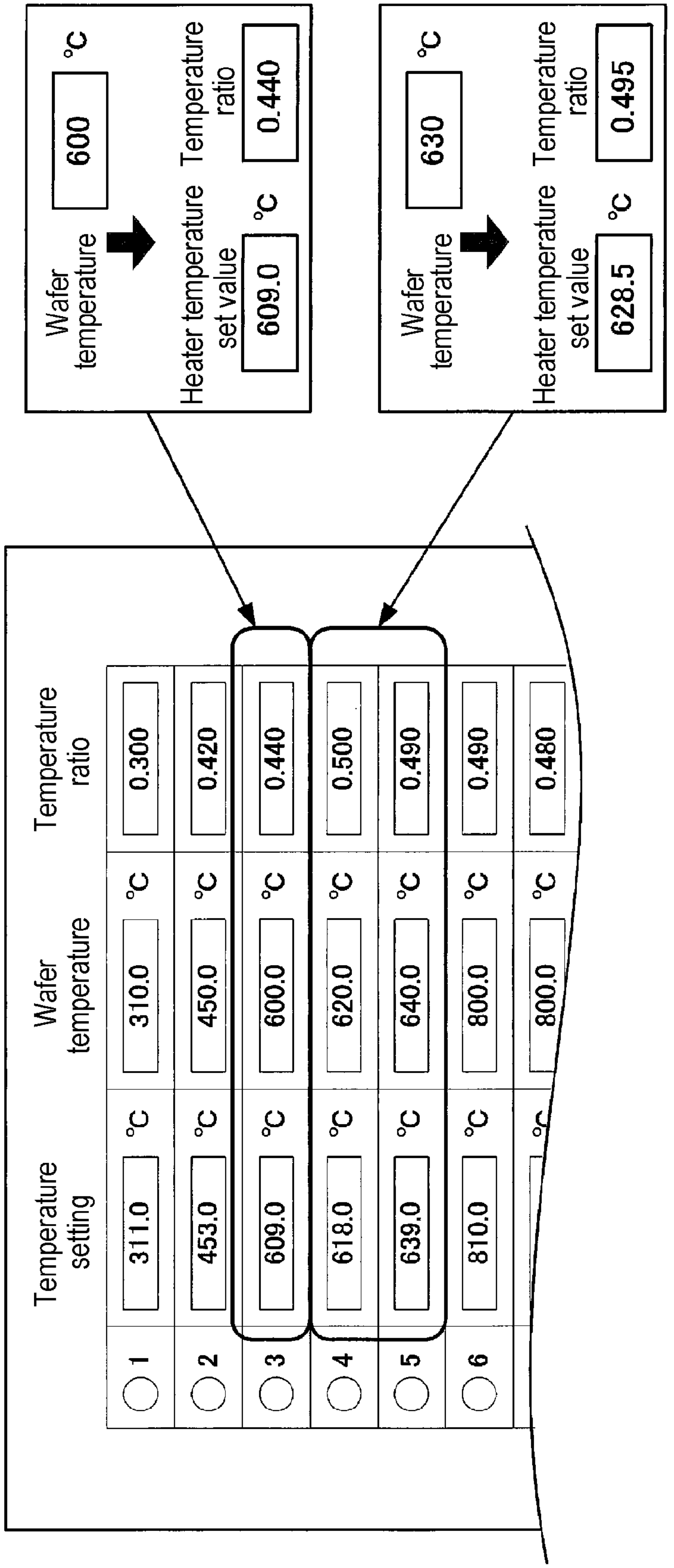
FIG. 9 is a diagram for explaining a data calculation method of a temperature control table.

In the one-point detection, as shown in FIG. 9, when 600 degrees C. is set as the wafer temperature in the process recipe, the controller 121 acquires the temperature set value of 609 degrees C. and the temperature ratio of 0.440 of the heater 217*b* corresponding to the wafer temperature of 600 degrees C. from the temperature control table. When the target temperature corresponding to the wafer temperature set in the process recipe is not present in the temperature control table, it means that an error occurs.

In the two-point detection, as shown in FIG. 9, when 600 degrees C. is set as the wafer temperature in the process recipe, the controller 121 acquires the temperature set value of 609 degrees C. and the temperature ratio of 0.440 of the heater 217*b* corresponding to the wafer temperature of 600 degrees C. from the temperature control table. When the target temperature corresponding to the wafer temperature set in the process recipe is not present in the temperature control table, the controller 121 determines wafer temperatures of two points in the temperature control table whose range includes the target temperature corresponding to the wafer temperature set in the process recipe. Specifically, when 630 degrees C. is set as the wafer temperature in the process recipe, the wafer temperatures of 620 degrees C. and 640 degrees C. are detected from the temperature control table, and two points of 620 degrees C. and 640 degrees C. are determined as the wafer temperatures.

Then, based on the temperature set value of 618 degrees C. of the heater 217*b* corresponding to the wafer temperature of 620 degrees C. and the temperature set value of 639 degrees C. of the heater 217*b* corresponding to the wafer temperature of 640 degrees C. in the temperature control table, the temperature set value of 628.5 degrees C. of the heater 217*b* is calculated by using a proportional expression. Further, based on the temperature ratio of 0.500 of the heater 217*b* corresponding to the wafer temperature of 620 degrees C. and the temperature ratio of 0.490 of the heater 217*b* corresponding to the wafer temperature of 640 degrees C., the temperature ratio of 0.495 is calculated by using a proportional expression.

That is, when the target temperature corresponding to the wafer temperature set in the process recipe is not present in the temperature control table, the controller 121 is configured to determine wafer temperatures of two points in the temperature control table whose range includes the target temperature corresponding to the wafer temperature set in the process recipe, and calculate and set the set values respectively set for the target temperature corresponding to the determined wafer temperatures of two points by using a proportional expression based on the set values set for the target temperature corresponding to the wafer temperatures of two points for at least one selected from the group of the temperature set value of the heater 217*b*, the temperature ratio of the heater 217*b*, the power set value of the lamp unit 280, and the lamp rate value in the process recipe. As a result, even when the wafer temperature as the target temperature is not found in the temperature control table, it is possible to create the process recipe to control the temperature, thereby reducing setting errors. Further, since a predetermined temperature control table may be searched, it is rare that an editing error occurs and editing becomes impossible, making it impossible to create a process recipe. Therefore, it is possible to suppress a decrease in an operating rate of an apparatus.

In the above-described embodiments of the present disclosure, the configuration in which the temperature control table includes the set values for the heater 217*b* and the lamp unit 280 are described, but without being limited thereto, the temperature control table may include setting values for temperature control items such as a high-frequency power supply, a microwave generator, and a cooler. This makes it possible to perform temperature control by using a plurality of temperature control items.

Further, in the above-described embodiments of the present disclosure, the configuration in which the lamp control value of the lamp unit 280 includes the first control value, which is the control value to raise the temperature of the lamp unit 280 to the wafer temperature set in the process recipe, and the second control value, which is the control value to stabilize the temperature of the lamp unit 280 at the wafer temperature set in the process recipe, is described, but without being limited thereto, the lamp control value may include the second control value alone. In that case, the controller 121 is configured to be capable of setting the second control value in succession to a temperature-raising step and a substrate-processing step (also referred to as process step) among the plurality of steps. As a result, the temperature of the wafer 200 may be controlled by the heater 217*b* and the lamp unit 280, thereby stabilizing and processing the wafer 200 at a desired temperature.

Further, in the above-described embodiments of the present disclosure, the configuration of using the temperature control table in which the set value of the heater 217*b* and the set value of the lamp unit 280 may be set for the target temperature of the wafer is described, but without being limited thereto, a temperature control table including a first temperature control table in which the set value of the heater 217*b* and the set value of the lamp unit 280 may be set for the target temperature of the wafer and a second temperature control table in which the set value of the lamp unit 280 may be set for the target temperature of the wafer may be used. In this case, in a case where the wafer temperature set in the process recipe is lower than a predetermined temperature, the controller 121 searches the first temperature control table and sets the set value for the target temperature corresponding to the wafer temperature in the first temperature control table to at least one selected from the group of the temperature set value of the heater 217*b* and the temperature ratio of the heater 217*b* in the process recipe. On the other hand, in a case where the wafer temperature set in the process recipe is equal to or higher than the predetermined temperature, the controller 121 searches the first temperature control table and the second temperature control table, sets the set value for the target temperature corresponding to the wafer temperature in the first temperature control table to at least one selected from the group of the temperature set value of the heater 217*b* and the temperature ratio of the heater 217*b* in the process recipe, and sets the set value for the target temperature corresponding to the wafer temperature in the second temperature control table to at least one selected from the group of the power set value of the lamp unit 280 and the lamp rate value in the process recipe. Even in this case, it is possible to create the process recipe to control the temperature with designation of the wafer temperature as the target temperature, thereby reducing setting errors.

Further, a temperature control table including a first temperature control table in which the set value of the heater 217*b* configured to heat the wafer may be set and a second temperature control table in which the set value of the heater 217*b* and the set value of the lamp unit 280 may be set may be used. Even in this case, it is possible to create the process recipe to control the temperature with designation of the wafer temperature as the target temperature, thereby reducing setting errors.

In this case, when the wafer temperature set in the process recipe is lower than a predetermined temperature, the controller 121 selects the first temperature control table and sets the set value for the target temperature corresponding to the substrate temperature in the first temperature control table to at least one selected from the group of the temperature set value of the heater and the temperature ratio of the heater in the process recipe.

On the other hand, when the wafer temperature set in the process recipe is equal to or higher than the predetermined temperature, the controller 121 selects the second temperature control table and sets the set value for the target temperature corresponding to the wafer temperature in the second temperature control table to at least one selected from the group of the temperature set value of the heater 217*b*, the temperature ratio of the heater 217*b*, the power set value of the lamp unit 280, and the lamp rate value in the process recipe.

It should be noted that the substrate processing apparatus 100 according to the embodiments of the present disclosure may be applied to an apparatus configured to process a glass substrate such as a LCD apparatus as well as to a semiconductor manufacturing apparatus configured to manufacture semiconductors. Further, the substrate processing apparatus 100 according to the embodiments of the present disclosure may be applied to various substrate processing apparatuses such as an exposure apparatus, a lithography apparatus, a coating apparatus, and a processing apparatus configured to use plasma.

Although various exemplary embodiments of the present disclosure are described above, the present disclosure is not limited to those embodiments and may be used in proper combination.

According to the present disclosure in some embodiments, it is possible to create a process recipe and control a temperature of a wafer by designating a wafer temperature as a target temperature, thereby reducing setting errors.

While certain embodiments are described above, these embodiments are presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A processing apparatus comprising:

a storage configured to store at least a temperature control table in which a set value of a heater configured to heat a substrate and a set value of a lamp configured to heat the substrate are set for a target temperature of the substrate, and a process recipe constituted by a plurality of steps of processing the substrate; and a controller configured to be capable of performing a control of executing the process recipe, wherein the controller is further configured to be capable of performing a control of:

searching the temperature control table with a target temperature corresponding to a substrate temperature set in the process recipe;

setting a set value for the target temperature corresponding to the substrate temperature to at least one selected from the group of a temperature set value of the heater, a temperature ratio of the heater, a power set value of the lamp, and a lamp rate value in the process recipe; and when the substrate temperature set in the process recipe is equal to or higher than a predetermined temperature, turning on a temperature function selection flag and setting a lamp control value including at least the power set value of the lamp and the lamp rate value.

2. The processing apparatus of claim 1, wherein when the target temperature corresponding to the substrate temperature set in the process recipe is not capable of being extracted from the temperature control table, the controller is further configured to be capable of performing a control such that at least one selected from the group of the temperature set value of the heater, the temperature ratio of the heater, the power set value of the lamp, and the lamp rate value in the process recipe is set as zero or not set.

3. The processing apparatus of claim 1, wherein when the target temperature corresponding to the substrate temperature set in the process recipe is not present in the temperature control table, the controller is configured to be capable of performing a control of:

searching the temperature control table with a target temperature corresponding to a substrate temperature closest to the substrate temperature set in the process recipe; and setting a set value for the target temperature corresponding to the substrate temperature closest to the substrate temperature set in the process recipe to at least one selected from the group of the temperature set value of the heater, the temperature ratio of the heater, the power set value of the lamp, and the lamp rate value in the process recipe.

4. The processing apparatus of claim 1, wherein when the target temperature corresponding to the substrate temperature set in the process recipe is not found in the temperature control table, the controller is configured to be capable of performing a control of:

determining substrate temperatures of two points in the temperature control table whose range includes the target temperature corresponding to the substrate temperature set in the process recipe; and calculating the set value for the target temperature corresponding to the substrate temperature set in the process recipe by using a proportional expression based on set values set for target temperatures respectively corresponding to the substrate temperatures of the two points, for each of at least one selected from the group of the temperature set value of the heater, the temperature ratio of the heater, the power set value of the lamp, and the lamp rate value in the process recipe.

5. The processing apparatus of claim 1, wherein the controller is configured to be capable of performing a control of turning on a lamp function selection flag when the temperature function selection flag is turned on.

6. The processing apparatus of claim 1, wherein the lamp control value includes:

a first control value which is a control value to raise a temperature of the lamp to the substrate temperature set in the process recipe; and a second control value which is a control value to stabilize the temperature of the lamp at the substrate temperature set in the process recipe.

7. The processing apparatus of claim 1, wherein the temperature control table includes a set value for at least one item selected from the group of the heater, a lamp unit, a high-frequency power supply, a microwave generator, and a cooler.

8. The processing apparatus of claim 1, wherein the lamp control value includes:

a first control value which is a control value to raise a temperature of the lamp to the substrate temperature set in the process recipe; and a second control value which is a control value to stabilize the temperature of the lamp at the substrate temperature set in the process recipe, and wherein the controller is configured to be capable of performing a control of setting the first control value and the second control value for one of the plurality of steps.

9. The processing apparatus of claim 1, wherein the lamp control value includes at least a second control value which is a control value to stabilize a temperature of the lamp at the substrate temperature set in the process recipe, and wherein the controller is configured to be capable of performing a control of setting the second control value in succession to a temperature-raising step and a substrate-processing step among the plurality of steps.

10. The processing apparatus of claim 1, wherein the controller is configured to be capable of performing a control of setting the set value for the target temperature corresponding to the substrate temperature in the temperature control table to each of the temperature set value of the heater, the temperature ratio of the heater, the power set value of the lamp, and the lamp rate value in the process recipe.

11. The processing apparatus of claim 1, wherein the temperature control table includes a first temperature control table in which the set value of the heater and the set value of the lamp are capable of being set for the target temperature of the substrate and a second temperature control table in which the set value of the lamp is capable of being set for the target temperature of the substrate, and wherein the controller is further configured to be capable of performing a control of:

searching the first temperature control table in a case where the substrate temperature set in the process recipe is lower than a predetermined temperature, and setting the set value for the target temperature corresponding to the substrate temperature in the first temperature control table to at least one selected from the group of the temperature set value of the heater and the temperature ratio of the heater in the process recipe.

12. The processing apparatus of claim 11, wherein the controller is further configured to be capable of performing a control of:

searching the first temperature control table and the second temperature control table in a case where the substrate temperature set in the process recipe is equal to or higher than the predetermined temperature, setting the set value for the target temperature corresponding to the substrate temperature in the first temperature control table to at least one selected from the group of the temperature set value of the heater and the temperature ratio of the heater in the process recipe, and setting the set value for the target temperature corresponding to the substrate temperature in the second temperature control table to at least one selected from the group of the power set value of the lamp and the lamp rate value in the process recipe.

13. The processing apparatus of claim 1, wherein the temperature control table includes a first temperature control table in which the set value of the heater is capable of being set for heating the substrate and a second temperature control table in which the set value of the heater and the set value of the lamp are capable of being set for heating the substrate, and wherein the controller is further configured to be capable of performing a control of:

selecting the first temperature control table in a case where the substrate temperature set in the process recipe is lower than a predetermined temperature, and setting the set value for the target temperature corresponding to the substrate temperature in the first temperature control table to at least one selected from the group of the temperature set value of the heater and the temperature ratio of the heater in the process recipe.

14. The processing apparatus of claim 13, wherein the controller is further configured to be capable of performing a control of:

selecting the second temperature control table in a case where the substrate temperature set in the process recipe is equal to or higher than the predetermined temperature, and setting the set value for the target temperature corresponding to the substrate temperature in the second temperature control table to at least one selected from the group of the temperature set value of the heater, the temperature ratio of the heater, the power set value of the lamp, and the lamp rate value in the process recipe.

15. The processing apparatus of claim 1, wherein the processing apparatus further comprises an operator including an editing screen configured to edit the process recipe, and wherein the operator is configured to execute any one event of download of the temperature control table, change of the temperature control table, change of the set values in the temperature control table, change of a temperature control mode set in the temperature control table, and change of a function selection button set in the temperature control table according to a predetermined screen event.

16. A non-transitory computer-readable recording medium storing a program that causes, by a computer, a substrate processing apparatus, to perform a process, wherein the substrate processing apparatus includes a controller configured to set a plurality of temperature control items to create a recipe and execute the recipe thus created to process a substrate, and wherein the process comprising:

storing at least a temperature control table in which a set value of a heater configured to heat the substrate and a set value of a lamp configured to heat the substrate are set for a target temperature of the substrate, and a process recipe configured to process the substrate;

searching the temperature control table with a target temperature corresponding to a substrate temperature set in the process recipe;

setting a set value for the target temperature corresponding to the substrate temperature to at least one selected from the group of a temperature set value of the heater, a temperature ratio of the heater, a power set value of the lamp, and a lamp rate value in the process recipe;

when the substrate temperature set in the process recipe is equal to or higher than a predetermined temperature, turning on a temperature function selection flag and setting a lamp control value including at least the power set value of the lamp and the lamp rate value; and executing the process recipe.

17. A substrate processing method, comprising:

storing at least a temperature control table in which a set value of a heater configured to heat a substrate and a set value of a lamp configured to heat the substrate are set for a target temperature of the substrate, and a process recipe configured to process the substrate;

searching the temperature control table with a target temperature corresponding to a substrate temperature set in the process recipe;

setting a set value for the target temperature corresponding to the substrate temperature to at least one selected from the group of a temperature set value of the heater, a temperature ratio of the heater, a power set value of the lamp, and a lamp rate value in the process recipe;

when the substrate temperature set in the process recipe is equal to or higher than a predetermined temperature, turning on a temperature function selection flag and setting a lamp control value including at least the power set value of the lamp and the lamp rate value; and executing the process recipe.

18. A method of manufacturing a semiconductor device, comprising the substrate processing method according to claim 17.

* * * * *